United States Patent [19]

Nishimura

[11] Patent Number: 4,646,307
[45] Date of Patent: Feb. 24, 1987

[54] MEMORY CONTENTS CONFIRMATION

[75] Inventor: Kosuke Nishimura, Yamatokoriyama, Japan

[73] Assignee: Sharp Kabushiki Kaisha, Osaka, Japan

[21] Appl. No.: 623,190

[22] Filed: Jun. 21, 1984

[30] Foreign Application Priority Data

Jun. 22, 1983 [JP] Japan .................................. 58-114004

[51] Int. Cl.$^4$ ............................................. G06F 11/16
[52] U.S. Cl. ........................................ 371/53; 371/66; 371/21
[58] Field of Search ....................... 371/53, 24, 21, 66, 371/15, 9, 10, 11, 49; 364/200, 900

[56] References Cited

U.S. PATENT DOCUMENTS

| | | | |
|---|---|---|---|
| 3,937,937 | 2/1976 | McVey | 371/66 |
| 4,266,294 | 5/1981 | Daughton | 364/900 |
| 4,354,230 | 10/1982 | Murphy | 364/200 |
| 4,354,251 | 10/1982 | Hellwig | 371/53 |
| 4,355,390 | 10/1982 | Hellwig | 371/53 |
| 4,558,416 | 12/1985 | Pauwels | 371/15 |

OTHER PUBLICATIONS

Crandall et al., Dynamic Self–Checking for a Read-Only Storage, IBM Tech. Discl. Bulletin, vol. 19, No. 8, Jan. 1977, pp. 2868–2869.

*Primary Examiner*—Michael R. Fleming
*Attorney, Agent, or Firm*—Birch, Stewart, Kolasch & Birch

[57] ABSTRACT

In an electronic apparatus, for example, a programmable calculator, a portable or handheld computer, a memory module, or a data collector, incorporating a battery backup RAM, the present invention provides means for first checking the memory contents when the power-OFF command has been activated, and then causes the results of the checking to be stored in a specific area of the RAM. When the memory contents checking command has been activated, the system rechecks the memory contents to see if the memory contents have varied. The invention securely confirms whether the memory contents of either the effective programs or data have been correctly backed up when either replacing the battery or during storage of an electronic apparatus that uses the battery backup RAM. This is particularly effective for portable or handheld programmable computers.

4 Claims, 3 Drawing Figures

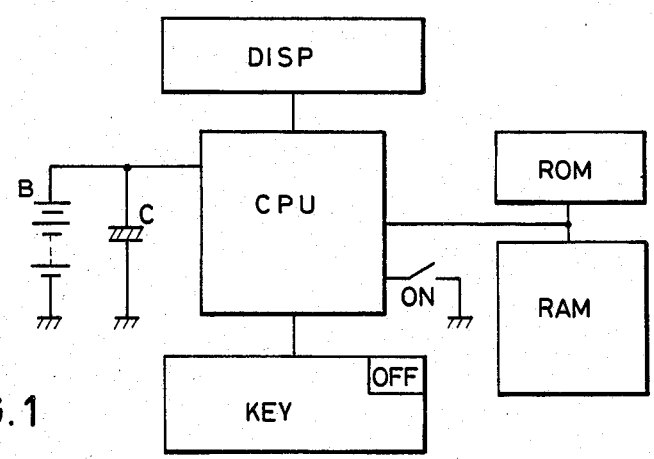
FIG.1
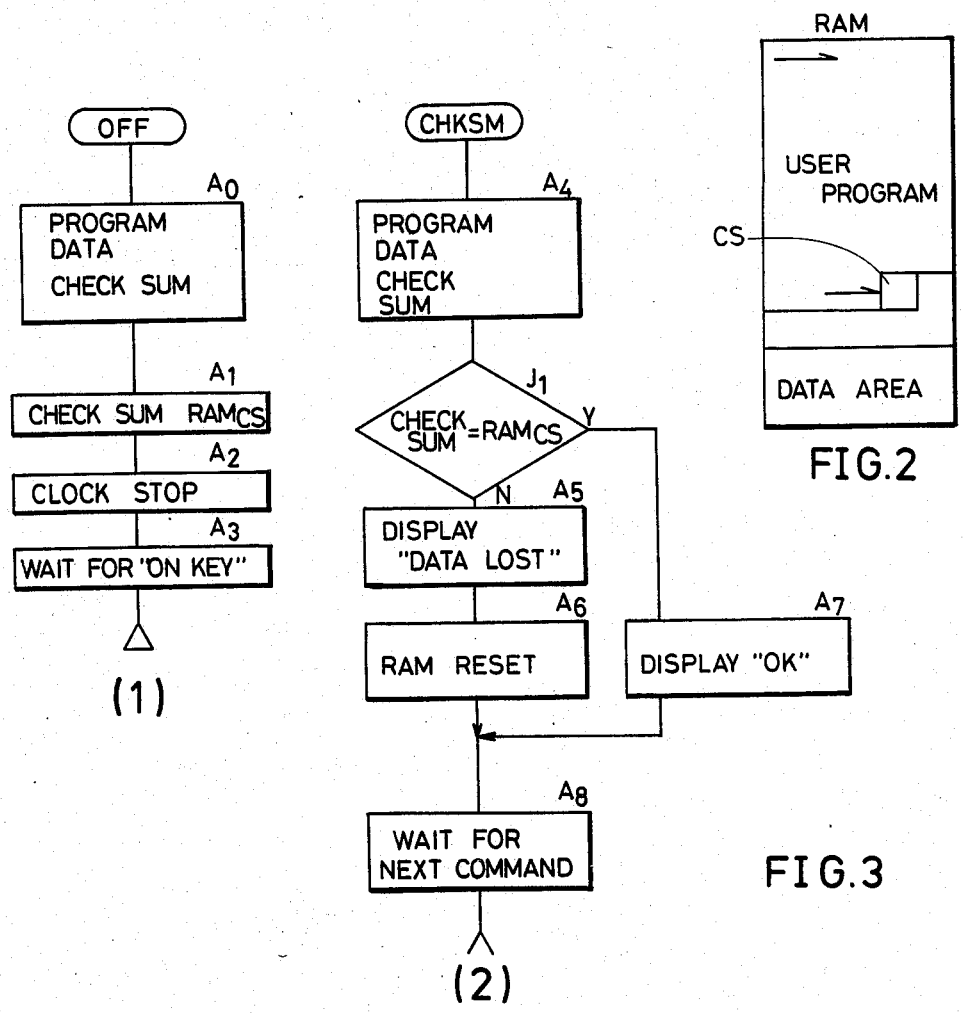
FIG.2
FIG.3

MEMORY CONTENTS CONFIRMATION

BACKGROUND OF THE INVENTION

The present invention relates to means for confirming whether the preset data has been correctly stored in the battery-backup RAM of an electronic apparatus such as the programmable calculator, portable or hand-held computer, and personal computer when either replacing the battery or during storage of the unit.

Conventionally, the capacitance of a capacitor has been made available for the protection of memory while replacing the battery of an electronic apparatus. However, it is still uncertain whether memory has been securely maintained. In other words, the contents of such a conventional battery backup memory may be lost by evaporation if the operator spends a long time replacing the battery. In addition, when such a battery-operated electronic apparatus is stored without being used for a long while, the contents of the RAM may not remain constant.

OBJECT AND SUMMARY OF THE INVENTION

The present invention aims at providing means for easily and securely confirming the memory contents of such an electronic apparatus containing a battery-backup RAM. The preferred embodiment of the present invention therefore provides means for securely confirming the memory contents of the RAM by first causing the CPU to check the memory contents of the RAM as soon as the power-OFF command has been activated, followed by storage of the results of the checking in a specific area of the memory RAM, and, when the next command has been activated for checking the memory contents, the CPU then checks to see if the memory contents have varied.

The preferred embodiment specifically activates the CPU when the power-OFF command has been activated so that it collects the sum of the effective program and/or data, or the sum of these that should be checked, and then stores these results in the specific area of the RAM. When the command has been activated for checking the memory contents of the RAM, the CPU again collects the sum of the effective program and/or data, and then compares the sum of these to those which were already stored in the specific area of the RAM so that the CPU can securely check to see if the memory contents have been correctly stored, or not. Since the CPU checks the memory contents summed from the entire programs and data, the actual memory contents can be securely confirmed.

BRIEF DESCRIPTION OF THE DRAWINGS

FIG. 1 shows the schematic block diagram of a computer incorporating the preferred embodiment of the present invention;

FIG. 2 shows the internal map of RAM; and

FIGS. 3(1) and 3(2) show the operational flowcharts of the preferred embodiment of the present invention.

DETAILED DESCRIPTION OF THE INVENTION

FIG. 1 shows the schematic block diagram of a computer incorporating the preferred embodiment of the present invention. The central processing unit CPU is connected to the display DISP, the keyboard KEY, the program memory ROM, data memory RAM that stores the user program data, battery B, and electrolytic capacitor C, thus making up a system that can be activated by pressing the power switch ON. FIG. 2 shows the internal map of RAM that stores the check-sum of the user programs and the data area in its CS. FIG. 3 shows the operational flowchart of the preferred embodiment of the present invention.

When either the power-OFF switch is operated or the power is automatically turned OFF by a timer circuit and the power-OFF command has been activated, step A0 causes the system to collect the check-sum from the effective programs and/or data, which is then stored in RAM during step A1. Step A2 then causes the clock to stop the counting, and then step A3 activates the stand-by mode of the power-ON switch. Display may be erased before step A0 is entered.

When confirming the check-sum, first, the check-sum CHKSM command is output by depressing the check command key, and then, step A4 causes the system to collect the check sum as was done during step A0. The check-sum is then sent to Step J1 where it is compared to that was previously collected when the power initially turned OFF. If the compared check-sums were exactly identical to each other, step A7 will display "OK". However, if they were not identical to each other, step A5 will display "DATA LOST". This will cause the following step A6 to reset the memory contents of RAM in order to prevent the entire operations from incorrectly being executed. Finally, the entire system will enter the stand-by mode before the next command is activated.

The preferred embodiment thus described has been designed so that the checking is activated by manually pressing the check key. The present invention also provides additional means, for example, for automatically checking the check-sum after detecting the battery replacing operation.

What is claimed is:

1. A method for confirming the contents of a battery backup RAM in an electronic apparatus comprising the steps of:
    (a) determining the contents of the RAM upon receiving a power-off command to disconnect power from the apparatus;
    (b) storing the result of the determination in a specific area of the RAM;
    (c) disconnecting power from the apparatus and placing said apparatus in a standby mode;
    (d) re-determining the contents of said RAM upon receiving a check-contents command after power has been restored to the apparatus;
    (e) comparing the result of the re-determination with the result stored in said specific area;
    (f) indicating a normal condition when both said results are identical; and
    (g) indicating a fault condition and resetting the contents of the RAM when both said results are not identical.

2. The method of claim 1, wherein the step of determining the contents comprises the step of calculating the check-sum of user programs and/or data stored in said RAM.

3. A device for confirming the contents of a battery backup RAM in an electronic apparatus comprising:
    means for determining the contents of the RAM upon receiving a power-off command to disconnect power from the apparatus;

means, responsive to said means for determining, for storing the result of the determination in a specific area of the RAM;

means, responsive to said power-off command, for disconnecting power from the apparatus and placing said apparatus in a standby mode;

means for re-determining the contents of said RAM upon receiving a check-contents command after power has been restored to the apparatus to develop a re-determination result;

means for comparing the re-determination result with the result stored in said specific area to determine if said results are identical; and means, responsive to said means for comparing, for indicating a normal condition when both said results are identical and for indicating a fault condition and resetting the contents of the RAM when both said results are not identical.

4. The device of claim 3, wherein the means for determining the contents comprises means for calculating the check-sum of user programs and/or data stored in said RAM.

* * * * *